(12) United States Patent
Lasser

(10) Patent No.: US 7,631,245 B2
(45) Date of Patent: Dec. 8, 2009

(54) NAND FLASH MEMORY CONTROLLER EXPORTING A NAND INTERFACE

(75) Inventor: Menahem Lasser, Kohav-Yair (IL)

(73) Assignee: SanDisk IL Ltd., Kfar Saba (IL)

( * ) Notice: Subject to any disclaimer, the term of this patent is extended or adjusted under 35 U.S.C. 154(b) by 877 days.

(21) Appl. No.: 11/326,336

(22) Filed: Jan. 6, 2006

(65) Prior Publication Data

US 2007/0074093 A1    Mar. 29, 2007

Related U.S. Application Data

(60) Provisional application No. 60/720,098, filed on Sep. 26, 2005.

(51) Int. Cl.
*G11C 29/00* (2006.01)
(52) U.S. Cl. ....................... 714/768; 365/185
(58) Field of Classification Search ................ 714/763, 714/776, 768; 365/185
See application file for complete search history.

(56) References Cited

U.S. PATENT DOCUMENTS

| | | | |
|---|---|---|---|
| 5,404,485 | A | 4/1995 | Ban |
| 5,434,825 | A | 7/1995 | Harari |
| 5,532,962 | A | 7/1996 | Auclair et al. |
| 5,799,168 | A | 8/1998 | Ban |
| 5,818,757 | A | 10/1998 | So et al. |
| 5,937,425 | A | 8/1999 | Ban |
| 5,943,283 | A | 8/1999 | Wong et al. |
| 6,034,882 | A | 3/2000 | Johnson et al. |
| 6,119,245 | A | 9/2000 | Hiratsuka |
| 6,181,599 | B1 | 1/2001 | Gongwer |
| 6,185,122 | B1 | 2/2001 | Johnson et al. |

(Continued)

FOREIGN PATENT DOCUMENTS

EP    1146428    10/2001

(Continued)

OTHER PUBLICATIONS

Toshiba TC58NVG1S3BFT00/TC58NVG1S8BFT000 Tentative, Toshiba MOS Digital Integrated Circuit Silicon Gate CMOS, pp. 1-37, 2003.

(Continued)

*Primary Examiner*—Esaw T Abraham
(74) *Attorney, Agent, or Firm*—Brinks Hofer Gilson & Lione

(57) ABSTRACT

A NAND controller for interfacing between a host device and a flash memory device (e.g. a NAND flash memory device) fabricated on a flash die is disclosed. In some embodiments, the presently disclosed NAND controller includes electronic circuitry fabricated on a controller die, the controller die being distinct from the flash die, a first interface (e.g. a host-type interface, for example, a NAND interface) for interfacing between the electronic circuitry and the flash memory device, and a second interface (e.g. a flash-type interface) for interfacing between the controller and the host device, wherein the second interface is a NAND interface. According to some embodiments, the first interface is an inter-die interface. According to some embodiments, the first interface is a NAND interface. Systems including the presently disclosed NAND controller are also disclosed. Methods for assembling the aforementioned systems, and for reading and writing data using NAND controllers are also disclosed.

35 Claims, 13 Drawing Sheets

U.S. PATENT DOCUMENTS

| | | | |
|---|---|---|---|
| 6,230,233 B1 | 5/2001 | Lofgren et al. | |
| 6,420,215 B1 | 7/2002 | Knall et al. | |
| 6,426,893 B1 | 7/2002 | Conley | |
| 6,498,851 B1 | 12/2002 | Wong | |
| 6,591,330 B2 | 7/2003 | Lasser | |
| 6,594,183 B1 | 7/2003 | Lofgren et al. | |
| 6,624,773 B2 | 9/2003 | Wong | |
| 6,631,085 B2 | 10/2003 | Kleveland et al. | |
| 6,683,817 B2 | 1/2004 | Wei et al. | |
| 6,694,415 B2 | 2/2004 | March et al. | |
| 6,715,044 B2 | 3/2004 | Lofgren et al. | |
| 6,721,820 B2 | 4/2004 | Zilberman et al. | |
| 6,760,805 B2 | 7/2004 | Lasser | |
| 6,988,175 B2 | 1/2006 | Lasser | |
| 7,012,835 B2 | 3/2006 | Gonzalez et al. | |
| 7,081,377 B2 | 7/2006 | Cleeves | |
| 7,120,729 B2 | 10/2006 | Gonzalez et al. | |
| 7,136,973 B2 | 11/2006 | Sinclair | |
| 7,149,119 B2 | 12/2006 | Fasoli | |
| 7,170,788 B1 | 1/2007 | Wan et al. | |
| 7,171,536 B2 | 1/2007 | Chang et al. | |
| 7,177,191 B2 | 2/2007 | Fasoli | |
| 7,177,977 B2 | 2/2007 | Chen et al. | |
| 7,218,552 B1 | 5/2007 | Wan et al. | |
| 7,224,607 B2 | 5/2007 | Gonzalez et al. | |
| 7,234,049 B2 * | 6/2007 | Choi et al. | 713/1 |
| 7,239,556 B2 * | 7/2007 | Abe et al. | 365/185.33 |
| 7,262,994 B2 | 8/2007 | Fong et al. | |
| 7,295,473 B2 | 11/2007 | Fong et al. | |
| 7,345,907 B2 | 3/2008 | Scheuerlein | |
| 7,349,258 B2 | 3/2008 | Fong et al. | |
| 7,355,888 B2 | 4/2008 | Hemink et al. | |
| 7,355,889 B2 | 4/2008 | Hemink et al. | |
| 7,362,604 B2 | 4/2008 | Scheuerlein | |
| 7,379,330 B2 | 5/2008 | Conley et al. | |
| 7,379,334 B2 * | 5/2008 | Murakami et al. | 365/185.17 |
| 7,392,343 B2 * | 6/2008 | Oshima | 711/115 |
| 7,406,572 B1 | 7/2008 | Nguyen | |
| 7,440,318 B2 | 10/2008 | Fong et al. | |
| 7,443,736 B2 | 10/2008 | Samachisa | |
| 7,447,065 B2 | 11/2008 | Fong et al. | |
| 7,447,066 B2 | 11/2008 | Conley et al. | |
| 7,464,259 B2 * | 12/2008 | Sukegawa et al. | 713/2 |
| 7,475,184 B2 * | 1/2009 | Lee | 711/103 |
| 7,495,956 B2 | 2/2009 | Fong et al. | |
| 2001/0028523 A1 | 10/2001 | Moro et al. | |
| 2003/0028704 A1 | 2/2003 | Mukaida et al. | |
| 2003/0051118 A1 | 3/2003 | Wu et al. | |
| 2003/0065899 A1 | 4/2003 | Gorobets | |
| 2003/0079077 A1 | 4/2003 | Piau et al. | |
| 2003/0097520 A1 | 5/2003 | Lai et al. | |
| 2003/0099134 A1 | 5/2003 | Lasser et al. | |
| 2003/0135688 A1 | 7/2003 | Tai | |
| 2003/0206442 A1 | 11/2003 | Tang et al. | |
| 2004/0205418 A1 | 10/2004 | Sakaue et al. | |
| 2005/0050235 A1 | 3/2005 | Choi | |
| 2005/0092846 A1 | 5/2005 | Lai et al. | |
| 2005/0180209 A1 | 8/2005 | Lasser | |
| 2005/0207231 A1 | 9/2005 | Kim | |
| 2005/0237814 A1 | 10/2005 | Li et al. | |
| 2005/0286306 A1 | 12/2005 | Srinivasan et al. | |
| 2006/0184709 A1 | 8/2006 | Sukegawa et al. | |
| 2006/0239450 A1 | 10/2006 | Holtzman et al. | |
| 2007/0074093 A1 | 3/2007 | Lasser et al. | |
| 2007/0088940 A1 | 4/2007 | Conley | |
| 2008/0046630 A1 | 2/2008 | Lasser | |
| 2008/0046641 A1 | 2/2008 | Lasser | |
| 2008/0151618 A1 | 6/2008 | Sharon et al. | |

FOREIGN PATENT DOCUMENTS

| | | |
|---|---|---|
| WO | 2005/066773 | 7/2005 |

OTHER PUBLICATIONS

Toshiba TC58NVG2D4BFT00/TC58NVG2D9BFT000 Tentative, Toshiba MOS Digital Integrated Circuit Silicon Gate CMOS, pp. 1-37, 2003.

Supplemental European Search Report and Opinion for EP Application No. 06796108.6, 8 pages, May 7, 2009.

Denali Software, "Spectra™ NAND Flash File System", http://www.denali.com/en/products/spectra_ffs.jsp, copyright 1994-2009, retrieved on Aug. 6, 2009, pp. 1-3.

"Innovation, Simplify Embedded NAND Flash Design", Adverstisement, 1 page.

Inoue, A. et al., "NAND Flash Applications Design Guide, System Solutions from Toshiba America Electronic Components, Inc.", Revision 1.0, Apr. 2003, pp. 1-29.

Office Action for U.S. Appl. No. 11/806,701, filed Jun. 22, 2009, 35 pages.

Office Action for U.S. Appl. No. 11/806,702, filed Jun. 18, 2009, 14 pages.

"Samsung Electronics Develops World's First Eight-Die Multi-Chip Package for Multimedia Cell Phones", http://www.samsung.com/us/business/seimconductor/newsView.do?news_id=628.0, Jan. 10, 2005.

Schwaderer, W. et al., "Understanding I/O Subsystems, First Edition", *Adaptec Press*, 1996, pp. ii-iii, 82-87, 176-191.

Serial ATA, "High Speed Serialized AT Attachment", Revision 1.0a, Jan. 7, 2003, 2 pages (title page and p. 144).

"Simplify MLC NAND Design with Toshiba Embedded NAND Solutions", http://www.toshiba.com/taec/adinfo/embeddednand/, retrieved on Aug. 4, 2009, 2 pages.

Toshiba LBA-NAND Simplifies Integration, http://www.toshiba.com/taec/adinfo/embeddednand/images/LBAblockDiagram.jpg, retrieved on Aug. 4, 2009, 1 page.

U.S. Appl. No. 12/539,379 entitled, "Controller and Method for Providing Read Status and Spare Block Management Information in Flash Memory System", filed Aug. 11, 2009, inventor: Robert D. Selinger.

U.S. Appl. No. 12/539,394 entitled, "Controller and Method for Interfacing Between a Host Controller in a Host and a Flash Memory Device", filed Aug. 11, 2009, inventors: Eliyahou Harari, Richard R. Heye and Robert D. Selinger.

U.S. Appl. No. 12/539,407 entitled, "Controller and Method for Detecting a Transmission Error Over a NAND Interface Using Error Detection Code", filed Aug. 11, 2009, inventor: Robert D. Selinger.

U.S. Appl. No. 12/539,417 entitled, "NAND Flash Memory Controller Exporting a NAND Interface", filed Aug. 11, 2009, inventors: Eliyahou Harari, Richard R. Heye, Robert D. Selinger and Menahem Lasser.

"USB 2.0 High-Speed Flash Drive Controller, ST72681", Revision 6 Feb. 2009 (previous revisions May 2005-Jan. 2009), pp. 1-34.

Extended European Search Report and Opinion for European Patent Application No. 09009022.6-1233, Sep. 21, 2009, 9 pages.

* cited by examiner

NAND FLASH MEMORY CONTROLLER EXPORTING A NAND INTERFACE

CROSS-REFERENCE TO RELATED APPLICATIONS

This patent application claims the benefit of U.S. Provisional Patent Application No. 60/720,098, filed Sep. 26, 2005 by the present inventor.

FIELD OF THE INVENTION

The present invention relates to NAND flash memory controllers that export to the host computer the same type of interface that is exported by a standard NAND flash memory device.

BACKGROUND OF THE INVENTION

Single Bit and Multi-Bit Flash Memory Cells

Flash memory devices have been known for many years. Typically, each memory cell within a flash memory device stores one bit of information. The traditional way to store a bit in a flash memory cell has been by supporting two states of the memory cell. One state represents a logical "0" and the other state represents a logical "1".

In a flash memory cell, the two states are implemented by having a floating gate situated above the cell's channel (the area connecting the source and drain elements of the cell's transistor), and having two valid states for the amount of charge stored within the floating gate. Typically, one state is with zero charge in the floating gate and is the unwritten state of the cell after being erased (commonly defined to represent the "1" state) and the other state is with some amount of negative charge in the floating gate (commonly defined to represent the "0" state). Having negative charge in the gate causes the threshold voltage of the cell's transistor (i.e. the voltage that has to be applied to the transistor's control gate in order to cause the transistor to conduct) to increase. It is possible to read the stored bit by checking the threshold voltage of the cell. If the threshold voltage is in the higher state then the bit value is "0" and if the threshold voltage is in the lower state then the bit value is "1". Actually there is no need to accurately read the cell's threshold voltage. All that is needed is to correctly identify in which of the two states the cell is currently located. For this purpose it is sufficient to compare the threshold voltage of the cell to a reference voltage that is between the two states, and to determine if the cell's threshold voltage is below or above the reference value.

FIG. 1A (prior art) shows graphically how this works. Specifically, FIG. 1A shows a distribution of the threshold voltages of a large population of cells. Because the cells in a flash device are not exactly identical in their characteristics and behavior (due to, for example, small variations in impurity concentrations or defects in the silicon structure), applying the same programming operation to all of the cells does not cause all of the cells to have exactly the same threshold voltage. Instead, the threshold voltage is distributed as shown in FIG. 1A. Cells storing a value of "1" typically have a negative threshold voltage, such that most of the cells have a threshold voltage close to the central voltage value of the left peak (labeled 1) of FIG. 1A, with fewer cells having threshold voltages lower or higher than the central voltage of the left peak. Similarly, cells storing a value of "0" typically have a positive threshold voltage, such that most of the cells have a threshold voltage close to the central voltage of the right peak (labeled 0) of FIG. 1A, with fewer cells having threshold voltages lower or higher than the central voltage of the right peak.

In recent years, a new kind of flash device has appeared on the market, using "Multi Level Cells" (MLC). The term "Multi-Level Cell" is misleading because flash memory with a single bit per cell uses multiple i.e. two levels, as described above. Therefore, the term "Single Bit Cell" (SBC) is used hereinafter to refer to a memory cell of two levels and the term "Multi-Bit Cell" (MBC) is used hereinafter to refer to a memory cell of more than two levels, i.e. more than one bit per cell. The most common MBC flash memories at present are ones with two bits per cell, and therefore examples are given below using such MBC memories. It should however be understood that the present invention is equally applicable to flash memory devices that support more than two bits per cell. A single MBC cell storing two bits of information is in one of four different states. As the cell's "state" is represented by the cell's threshold voltage, an MBC cell supports four different valid ranges for the cell's threshold voltage. FIG. 1B (prior art) shows the threshold voltage distribution for a typical MBC cell of two bits per cell. As expected, FIG. 1B has four peaks, each peak corresponding to one state. As for the SBC, each state is actually a voltage range and not a single voltage. When reading the cell's contents, the cell's threshold voltage must be correctly identified in a definite voltage range. For a prior art example of an MBC flash device see U.S. Pat. No. 5,434,825 to Harari that is included by reference for all purposes as if fully set forth herein.

A cell designed for MBC operation e.g. in four states is typically operable as an SBC cell with two states. For example, Conley et al. in U.S. Pat. No. 6,426,893 incorporated by reference for all purposes as if fully set forth herein, disclosed the use of both MBC and SBC modes within the same device, and selecting certain parts of the device to operate with highest density in MBC mode, while other parts are used in SBC mode to provide better performance.

MBC devices provide a significant cost advantage. An MBC device with two bits per cell requires about half the area of a silicon wafer than an SBC of similar capacity. However, there are drawbacks to using MBC flash. Average read and write times of MBC memories are longer than of SBC memories, resulting in worse performance. Also, the reliability of MBC is lower than SBC. The differences between the threshold voltage ranges in MBC are much smaller than in SBC. Thus, a disturbance in the threshold voltage (e.g. leakage of stored charge causing a threshold voltage drift or interference from operating neighboring cells) that are insignificant in SBC because of the large gap between the two states, may cause an MBC cell to move from one state to another, resulting in an erroneous bit. The end result is a lower performance specification of MBC cells in terms of data retention time or the endurance of the device to many write/erase cycles.

NAND Flash Memory Devices

Flash memory devices are typically divided into NOR devices and NAND devices, the names being derived from the way the individual memory cells are interconnected within the cells array. NOR devices are random access—a host computer accessing a NOR flash device can provide the device any address on its address pins and immediately retrieve data stored in that address on the device's data pins. This is much like SRAM or EPROM memories operate. NAND devices, on the other hand, are not random access but serial access. It is not possible to access any random address in the way described above for NOR—instead the host has to write into the device a sequence of bytes which identifies both the type of the requested command (e.g. read, write, erase, etc.) and the address to be used for that command. The address identifies a page (the smallest chunk of flash memory that can we written in a single operation) or a block (the smallest chunk of flash memory that can be erased in a single operation), and not a single byte or word. It is true that the read and write command sequences contain addresses of single bytes or words, but in reality the NAND flash device always reads from the memory cells and writes to the memory cells complete pages. After a page of data is read from the array into a buffer inside the device, the host can access the data bytes or words one by one by serially clocking them out using a strobe signal.

Because of the non-random access of NAND devices, they cannot be used for running code directly from the flash memory. This is contrary to NOR devices which support direct code execution (typically called "eXecution In Place" or "XIP"). Therefore NOR devices are the ones typically used for code storage. However, NAND devices have advantages that make them very useful for data storage. NAND devices are cheaper than NOR devices of the same bit capacity, or equivalently—NAND devices provide many more bits of storage than NOR devices for the same cost. Also, the write and erase performance of NAND devices is much faster than of NOR devices. These advantages make the NAND flash memory technology the technology of choice for storing data.

NAND Interface Protocols

A typical SBC NAND device is Toshiba TC58NVG1S3B that provides 2 Gbit of storage. A typical MBC NAND device is Toshiba TC58NVG2D4B that provides 4 Gbit of storage. The data sheets of both devices are incorporated by reference for all purposes as if fully set forth herein.

As can be seen from the aforementioned data sheets, those two NAND devices have a similar interface. These NAND devices use the same electrical signals for coordinating commands and data transfer between the NAND flash device and a host device. Those signals include data lines and a few control signals—ALE (Address Latch Enable), CLE (Command Latch Enable), WE\ (Write Enable), and more. The SBC and MBC devices are not fully identical in their behavior—the time it takes to write an MBC page is much longer than time it takes to write an SBC page. However, the electrical signals used in both devices and their functionalities are the same. This type of interface protocol is known in the art as "NAND interface". Even though the "NAND interface protocol" has not, to date, been formally standardized by a standardization body, the manufacturers of NAND flash devices all follow the same protocol for supporting the basic subset of NAND flash functionality. This is done so that customers using NAND devices within their electronic products could use NAND devices from any manufacturer without having to tailor their hardware or software for operating with the devices of a specific vendor. It is noted that even NAND vendors that provide extra functionality beyond this basic subset of functionality ensure that the basic functionality is provided in order to provide compatibility with the protocol used by the other vendors, at least to some extent.

In this application the term "NAND Interface protocol" (or "NAND interface" in short) means an interface protocol between an initiating device and a responding device that in general follows the protocol between a host device and a NAND flash device for the basic read, write and erase operations, even if it is not fully compatible with all timing parameters, not fully compatible with respect to other commands supported by NAND devices, or contains additional commands not supported by NAND devices. In other words, the term "NAND interface" refers to any interface protocol that uses sequences of transferred bytes equivalent in functionality to the sequences of bytes used when interfacing with the Toshiba TC58NVG1S3B NAND device for reading (opcode 00H), writing (opcode 80H) and erasing (opcode 60H), and also uses control signals equivalent in functionality to the CLE, ALE, CE, WE and RE signals of the above NAND device.

It is noted that the "NAND interface protocol" is not symmetric. Thus, it is always the host device which initiates the interaction over a NAND interface, and never the flash device.

A given device (e.g. a controller, flash device, host device, etc.) is said to comprise, include or have a "NAND interface" if the given device includes elements (e.g. hardware, software, firmware or any combination thereof) necessary for supporting the NAND interface protocol (e.g. for interacting with another device using a NAND interface protocol).

An interface (e.g. a NAND interface or an interface associated with another protocol) of a given device (e.g. a controller device) may be a "host-side interface" (e.g. the given device is adapted to interact with a host device using the host-side interface) or the interface of the given device may be a "flash memory device-side interface" (e.g. the given device is adapted to interact with a flash memory device using the flash memory device-side interface). The terms "flash memory device-side interface", "flash device-side interface" and "flash-side interface" are used herein interchangeably.

These terms (i.e. "host-side interface" and "flash device-side interface") should not be confused with the terms "host-type interface" and "flash-type interface" which are terminology used herein to differentiate between the two sides of a NAND interface protocol, as this protocol is not symmetric. Furthermore, because it is always the host that initiates the interaction, we note that a given device is said to have a "host-type interface" if the device includes the necessary hardware and/or software for implementing the host side of the NAND interface protocol (i.e. for presenting a NAND host, and initiating the NAND protocol interaction) Similarly, because the flash device never initiates the interaction, we note that a given device is said to have a "flash-type interface" if the device includes the necessary hardware and/or software for implementing the flash side of the NAND protocol (i.e. for presenting a NAND flash device).

Typically, "host-type interfaces" (i.e. those which play the role of the host) are "flash device-side interfaces" (i.e. they interact with flash devices or with hardware emulating a flash device) while "flash device-type interfaces" (i.e. those which play the role of the flash device) are typically "hosts-side interfaces" (i.e. they interact with host devices or with hardware emulating a host device). In this application the term "host device" (or "host" in short) means any device that has processing power and is capable of interfacing with a flash memory device. A host device may be a personal computer, a PDA, a cellular phone, a game console, etc.

Typically, NAND devices are relatively difficult to interface and work with. One reason for that is the relatively complex (compared to NOR devices) protocol for accessing them, as described above. Another difficulty is the existence of errors in the data read from NAND devices, In contrast, NOR devices that can be assumed to always return correct data. This inherent non-reliability of NAND devices requires the use of Error Detection Codes (EDC) and Error Correction Codes (ECC).

Manufacturers of SBC NAND flash devices typically advise users to apply an Error Correction Code capable of correcting 1 bit error in each page of 512 bytes of data. But data sheets of MBC NAND flash devices typically advise applying an ECC capable of correcting 4 bit errors in each page of 512 bytes of data. For pages of size 2048 bytes such as in the case of the NAND devices mentioned above (known as "large block devices"), the suggestion is to apply error correction per each portion of 512 bytes of the page. In this application the term "N-bit ECC" refers to an ECC scheme capable of correcting N bit errors in 512 bytes of data, regardless if the 512 bytes are the size of one page, less than one page, or more than one page.

NAND Controllers

Because of those complexities of NAND devices, it is the common practice to use a "NAND controller" for controlling the use of a NAND device in an electronic system. It is true that it is possible to operate and use a NAND device directly by a host device with no intervening NAND controller, and there are systems that actually operate like this. However, this architecture suffers from many disadvantages. First, the host has to individually manipulate each one of the NAND device's control signals (e.g. CLE or ALE), which is cumbersome and time-consuming for the host. Second, the support of EDC and ECC puts a severe burden on the host—parity bits have to be calculated for each page written, and error detection calculations (and sometimes also error correction calculations) must be performed by the host. All this makes such "no controller" architecture relatively slow and inefficient.

Using a NAND controller significantly simplifies the host's tasks when using the NAND device. The processor interacts with the controller using a protocol that is much more convenient to use—a request for writing a page may be sent as a single command code followed by address and data, instead of having to bother with the complex sequencing of control lines and NAND command codes. The controller then converts the host-controller protocol into the equivalent NAND protocol sequences, while the host is free to do other tasks (or just to wait for the NAND operation to complete, if so desired).

There are several options in the prior art regarding the location where the NAND controller resides within the system. A first approach is shown in FIG. 2. Here the NAND controller 114 is physically located within the host processor 112A of the host device 110A. If the host processor 112A is implemented as a single die, then the controller 114 is incorporated on the same die. This is for example the case in some of the OMAP processors manufactured and sold by Texas Instruments. In a system built using this architecture the host processor typically interacts with the NAND controller using some proprietary protocol, as the interaction is internal to the host processor and there is no benefit in using a standard protocol.

A second prior art approach is shown in FIGS. 3A-3B. Here the NAND controller 116 is a separate physical element, residing between the host processor 112B of the host 110B and the NAND device 120A. This is for example the case in portable USB Flash Drives (UFDs), such as the DiskOnKey manufactured and sold by M-Systems Flash Disk Pioneers, where there is a NAND controller 116 packaged inside the UFD and interacting using a device side NAND interface 124 with the NAND device 120A on one side and with the host processor 112B on the other side (using a host side USB interface 122 which uses the USB protocol). In a system built using this architecture the host processor typically interacts with the NAND controller using a standard protocol such as USB or ATA, as the interaction is external to the processor and it is more convenient to use standard protocols that are already supported by the processor for other purposes.

Note that according to the terminology previously defined, NAND interface 124 is a "flash memory device side NAND interface" (i.e. adapted to interact with NAND flash device 120A) but at the same time NAND interface 124 is also a host-type NAND interface (i.e. adapted to initiate the NAND protocol interaction).

A third prior art approach is shown in FIG. 4. Here the NAND controller 118 is physically located within the NAND device 120B. The flash device and the controller may even be implemented on the same die. This is for example the case in some of the MDOC storages devices manufactured and sold by M-Systems Flash Disk Pioneers and in the OneNAND devices manufactured and sold by Samsung Electronics. In a system built using this architecture the host processor 112B typically interacts with the NAND controller using either a standard protocol such as USB or a semi-standard protocol as is the case in the MDOC and OneNAND examples mentioned above.

We can deduce from the above that a prior art stand-alone NAND controller (that is not integrated with neither the NAND device nor the host processor) will typically have some standard interface on its host side, and a NAND interface on its flash memory device side (for example, see FIG. 3B). Indeed one can find in the market NAND controllers exporting many interface types—USB, SD (SecureDigital), MMC (MultiMediaCard), and more. However, one cannot currently find a stand-alone NAND controller that exports NAND interface to the host. Indeed, this is reasonable to expect—a host processor that does not have built-in NAND support and requires an external controller for that purpose, typically does not have a NAND interface and cannot directly connect to a device exporting a NAND interface and therefore has no use of a controller with host-side NAND interface. On the other hand, a host processor that has built-in NAND support typically also includes a built-in NAND controller and can connect directly to a NAND device, and therefore has no need for an external NAND controller.

The prior art described above leaves one problem unsolved. Assume that there is a host processor incorporating a built-in NAND controller and a NAND interface as in FIG. 2. The built-in controller is designed to work with NAND devices of a certain level of reliability. This is so because a NAND controller provides a certain level of error detection and correction, and therefore cannot support NAND devices with lower reliability. For example, a NAND controller having a 1-bit ECC can work with SBC NAND devices that are specified by their manufacturers to require only this level of error correction. Such controller cannot work with two-bit-per-cell MBC NAND devices because they require 4-bit ECC, and therefore some data might not be read correctly into the processor. Similarly, a NAND controller providing 4-bit ECC can work with current two-bit-per-cell MBC NAND, but will not work with next generation MBC NAND devices that will most probably require a higher level of ECC capability.

This is so because future MBC NAND devices are expected to be less reliable than current MBC devices and to require a much stronger ECC capability. The reasons for the reduced reliability and increased error rate are twofold:

a. The process used for manufacturing NAND devices is continuously being improved to yield smaller memory cells. While a few years ago NAND devices used 0.4 micron process, currently they use 90 nm and 70 nm technology, and this shrinking trend is expected to continue. With shrinking dimensions of the memory cells comes lower reliability, as the small dimensions make the cells more sensitive to physical effects and phenomena that previously were not important.

b. When MBC cells with more than two bits per cell will become commercially available, they will necessarily be much less reliable than SBC cells and two-bit-per-cell MBC cells. The larger number of states that have to be represented by the cell's threshold voltage imply that the margins between states are smaller and even smaller disturbances and drifts result in incorrect reading of data. This effect could already be witnessed in the comparison between SLC and two-bit-per-cell MBC, where the ECC requirements increased from 1-bit ECC to 4-bit ECC.

Returning now to the host processor 112A with the built-in NAND controller 114, suppose the controller 114 supports only 1-bit ECC. Then this processor might not be able to use MBC NAND even though this is highly desirable because of the MBC NAND lower cost. If the MBC NAND is connected to the NAND interface of the built-in controller of the processor, which might be the only way to connect it to the processor, then the MBC NAND generates too many errors for the limited-capability ECC of the built-in controller to correct.

Similarly, if the built-in controller supports 4-bit ECC, it can use both SLC and two-bit-per-cell MBC NAND. But when NAND devices with lower reliability appear in the market, the processor is not able to benefit from their lower price because its built-in controller is not able to provide the required level of error correction.

Therefore we see that the state of the prior art does not provide a good solution to the problem of benefiting from the cost advantage of a new NAND device, while using a host processor incorporating a built-in NAND controller designed to support a previous generation of NAND devices.

There is an ongoing need for devices and methods that provide compatibility between a host device having an onboard NAND controller and successive generations of NAND flash memory devices.

SUMMARY OF THE INVENTION

The aforementioned needs are satisfied by several aspects of the present invention.

It is now disclosed for the first time a controller for interfacing between a host device and a flash memory device (e.g. a NAND flash memory device) fabricated on a flash die. The presently disclosed controller includes (a) electronic circuitry fabricated on a controller die, the controller die being distinct from the flash die, (b) a first interface (for example, a host-type interface) for interfacing between the electronic circuitry and the flash memory device (e.g. the NAND flash memory device), and (c) a second interface (for example, a flash-type interface) for interfacing between the controller and the host device, wherein the second interface is a NAND interface.

According to some embodiments, the first interface is an inter-die interface.

According to some embodiments, the first interface is a NAND interface.

According to some embodiments, the presently disclosed controller further includes (d) an error correction module for providing error correction for data received through one of the first and second interface.

According to some embodiments, the presently disclosed controller further includes (d) at least one additional host-side interface for interfacing with the host device.

It is now disclosed for the first time a data storage system including (a) a flash memory device fabricated on a flash die, and (b) the presently disclosed NAND controller, where the controller is operative to communicate with the flash memory device through the first interface.

According to some embodiments, the presently disclosed system further includes (c) a common packaging, wherein the flash memory device and the controller are both provided within the common packaging.

According to some embodiments, the presently disclosed system further includes (c) separate respective packagings, wherein each of the flash memory device and the controller is provided within a respective packaging.

According to some embodiments, the presently disclosed system further includes (c) a printed circuit board on which the flash memory device and the controller are mounted, wherein the flash die is directly mounted on the printed circuit board without a package.

According to some embodiments, the presently disclosed system further includes (c) a printed circuit board on which the flash memory device and the controller are mounted, wherein the controller die is directly mounted on the printed circuit board without a package.

It is now disclosed for the first time a data storage system including (a) a host device, (b) a flash memory device fabricated on a flash die, and (c) the presently disclosed NAND controller operative to communicate with both the flash memory device through the first interface and with the host device through the second interface.

It is now disclosed a method of writing data from a host device including the steps of: (a) providing a flash memory device fabricated on a flash die and a controller fabricated on a controller die, the flash die being distinct from the controller die, (b) issuing a write command from the host device to the controller according to a NAND interface protocol, and (c) issuing a write command from the controller to the flash memory device according to a NAND interface protocol.

According to some embodiments, the presently disclosed method further includes the step of (d) calculating parity bits by the controller.

It is now disclosed a method of reading data to a host device including the steps of: (a) providing a flash memory device fabricated on a flash die and a controller fabricated on a controller die, the flash die being distinct from the controller die, (b) issuing a read command from the host device to the controller according to a NAND interface protocol, and (c) issuing a read command from the controller to the flash memory device according to a NAND interface protocol.

According to some embodiments, the presently disclosed method further includes the steps of (d) retrieving the data from the flash memory device to the controller, (e) retrieving parity bits associated with the retrieved data from the flash memory device to the controller, (f) correcting the retrieved data according to the retrieved parity bits, thereby generating corrected data, and (g) retrieving the corrected data from the controller to the host device.

It is now disclosed for the first time a method of creating a data storage system including the steps of (a) providing a flash memory device fabricated on a flash die, (b) providing the presently disclosed NAND controller, and (c) deploying the flash controller to the flash memory device such that the flash controller is operative to communicate with the flash memory device through the first interface.

According to some embodiments, the presently disclosed method further includes the step of (d) packaging the flash controller and the flash memory device within a single package.

According to some embodiments, the flash memory device and the flash controller reside within separate respective packages, and the deploying includes engaging the respective packages to each other.

According to some embodiments, the presently disclosed method further includes the step of (d) mounting the flash memory device and the controller onto a printed circuit board, wherein the mounting includes directly mounting the flash memory die onto the printed circuit board without a package.

According to some embodiments, the presently disclosed method further includes the step of (d) mounting the flash memory device and the controller onto a printed circuit board, wherein the mounting includes directly mounting the controller die onto the printed circuit board without a package.

According to some embodiments, the presently disclosed method further includes the step of (d) deploying the data storage system to a host device such that the flash controller is operative to communicate with the host device through the second interface.

These and further embodiments will be apparent from the detailed description and examples that follow.

DETAILED DESCRIPTION OF THE INVENTION

The present invention will now be described in terms of specific, example embodiments. It is to be understood that the invention is not limited to the example embodiments disclosed. It should also be understood that not every feature of the controllers, systems including controllers, and methods of reading and data described is necessary to implement the invention as claimed in any particular one of the appended claims. Various elements and features of devices are described to fully enable the invention. It should also be understood that throughout this disclosure, where a process or method is shown or described, the steps of the method may be performed in any order or simultaneously, unless it is clear from the context that one step depends on another being performed first.

The present inventor is disclosing for the first time a new type of NAND controller, characterized by the fact that the interface it exports to the host side is a NAND interface. In some embodiments, this presently disclosed controller has NAND interfaces on both sides—on the flash memory device side, where the controller plays the role of a host towards the NAND device, and on the host device side, where the controller plays the role of a NAND device towards the host.

For the purposes of this disclosure, a "NAND flash memory device" is defined as electronic circuitry including a plurality of NAND flash memory cells and any necessary control circuitry (e.g. circuitry for providing a flash-type interface) for storing data within the NAND flash memory cells. It is noted that the "NAND flash memory device" does not necessarily have its own dedicated housing, and may reside with another "device" such as a controller within a single housing. In some embodiments, the "NAND flash memory device" is directly mounted onto a printed circuit board without any packing.

Furthermore, in some embodiments, the controller includes an error correction capability that is sufficient for correcting the many errors of a lower-reliability NAND device. Because these errors are corrected by the controller, the controller can present to the host a flash device having no errors at all, or having a smaller number of errors—small enough for the error correction capability of the host's built-in NAND controller to handle.

Figure 1A:
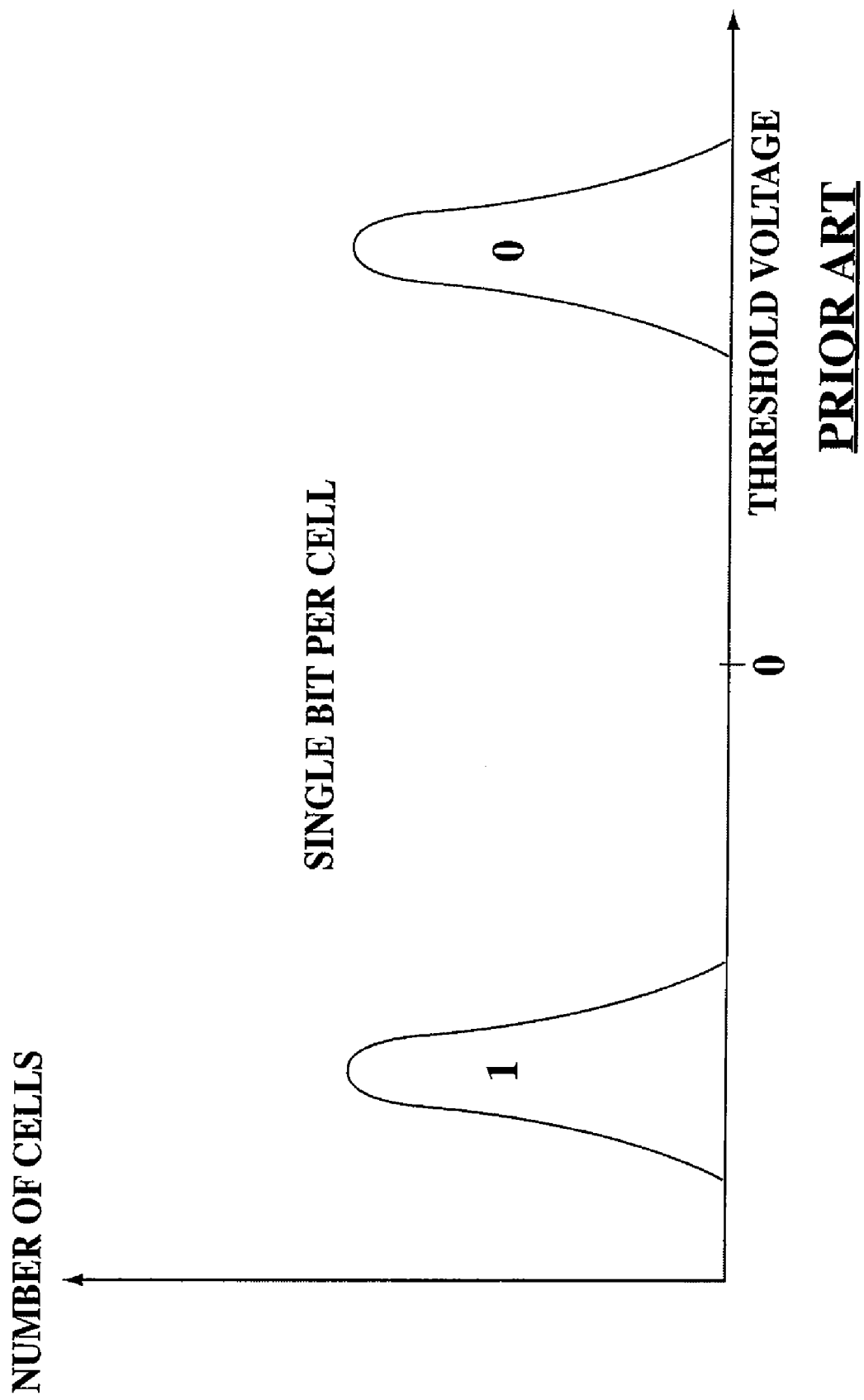
FIGS. 1A-1B provide a graphical illustration of distributions of thresholds voltages of a large population of memory cells (prior art).
Figure 1B:
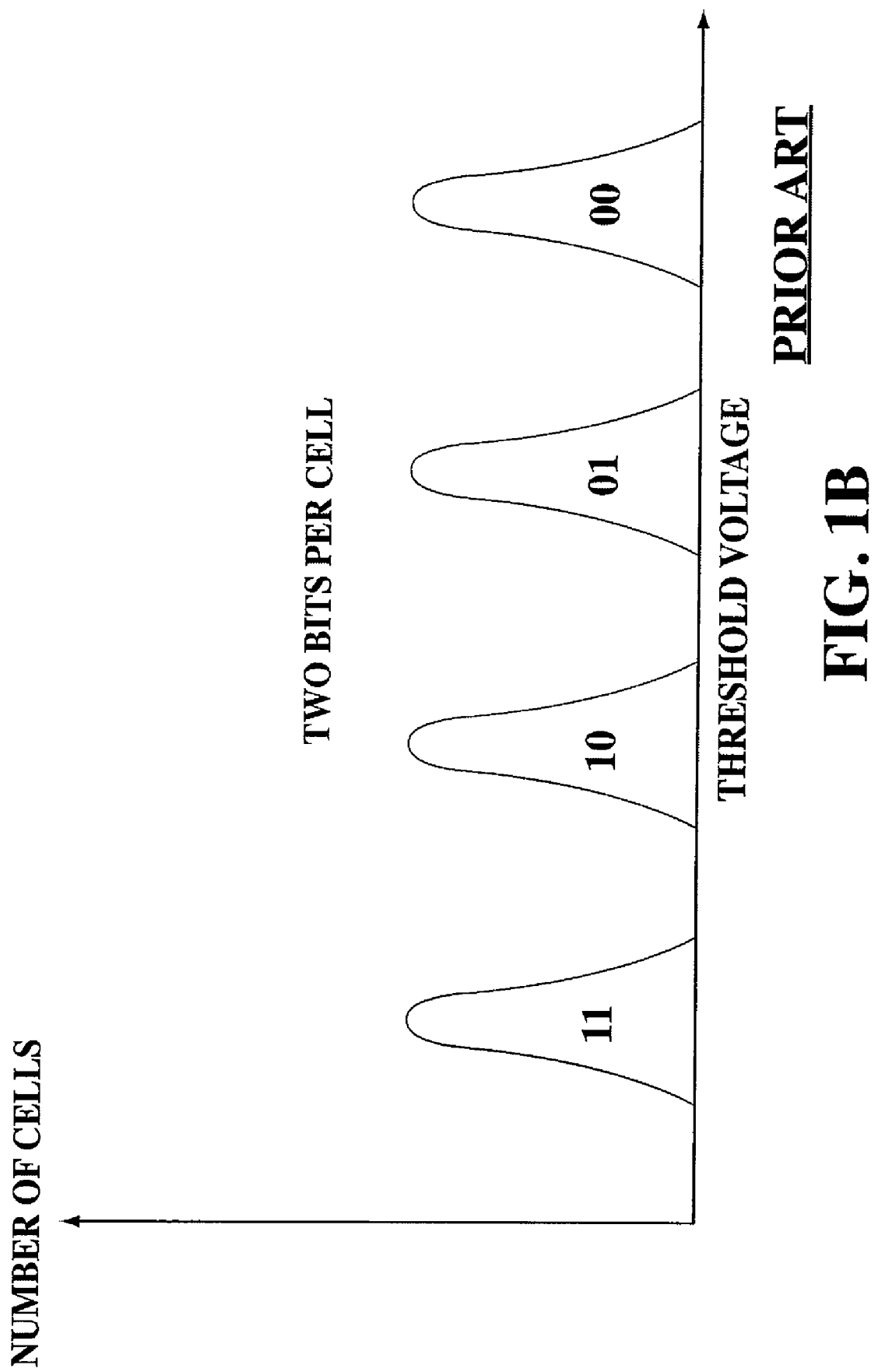
Figure 2:
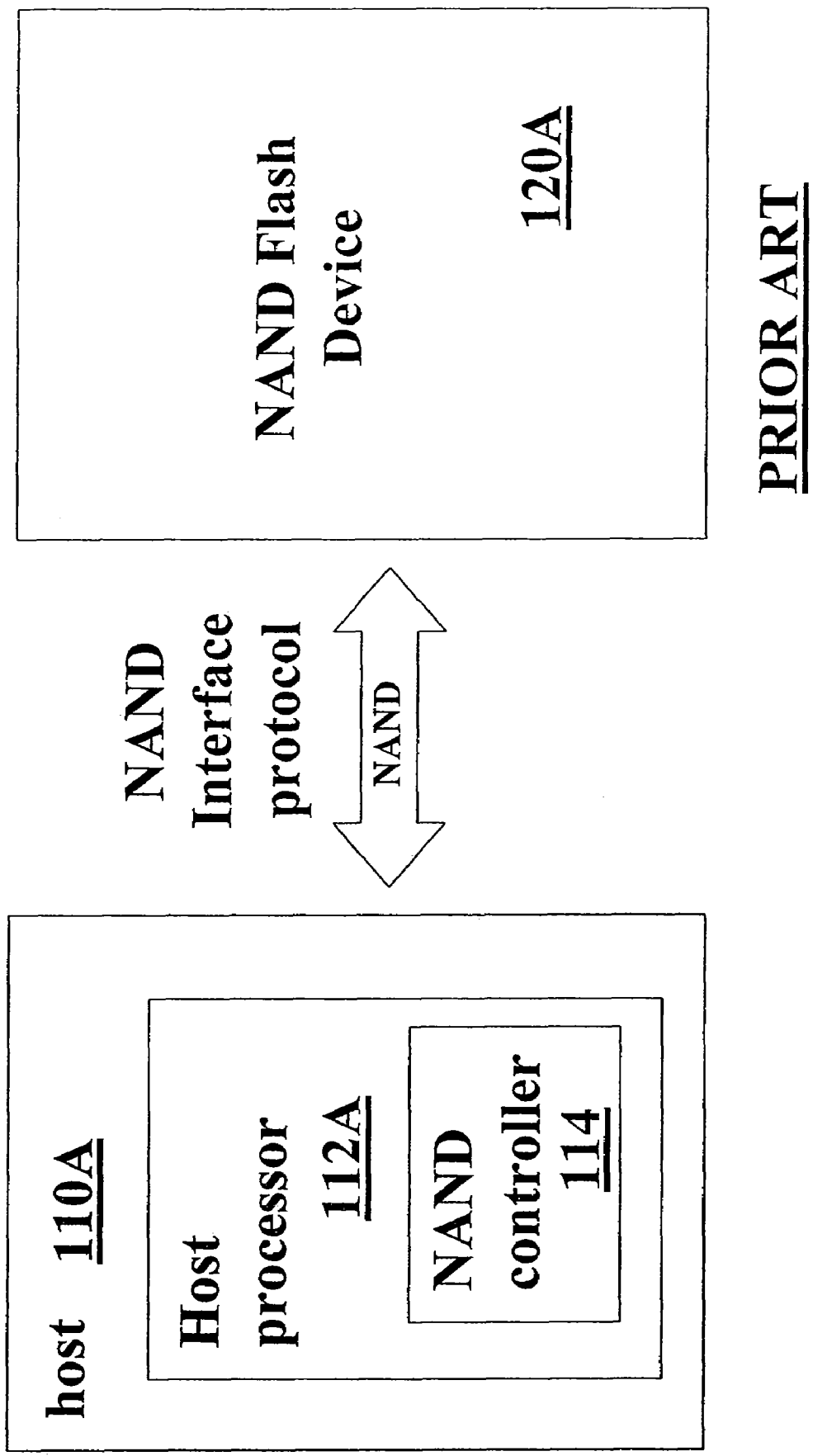
FIG. 2 provides a block diagram of a prior art system including a host device and a NAND flash device.
Figure 3A:
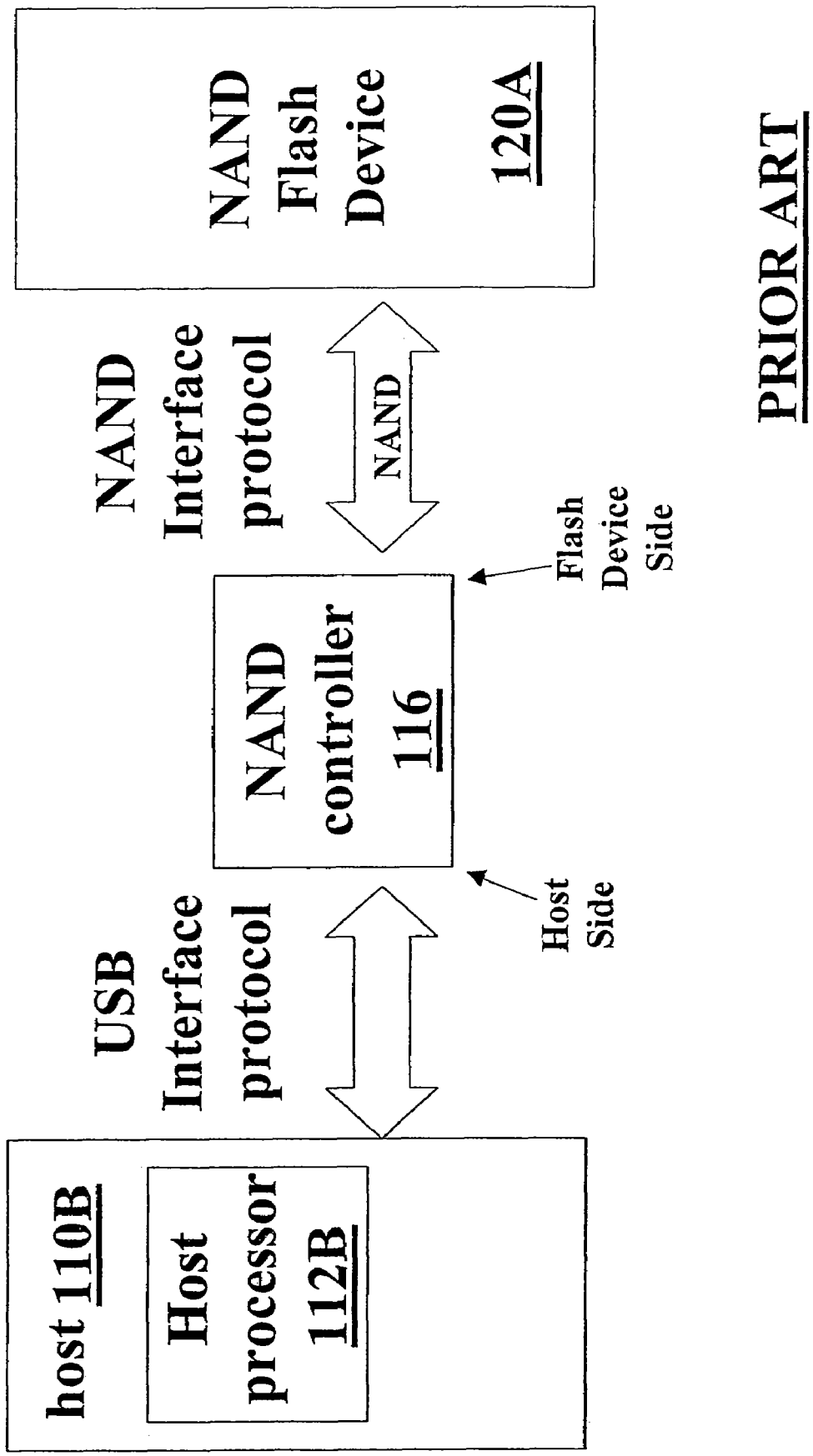
FIG. 3A provides a block diagram of a prior art system including a host device, a NAND controller and a NAND flash device.
Figure 3B:
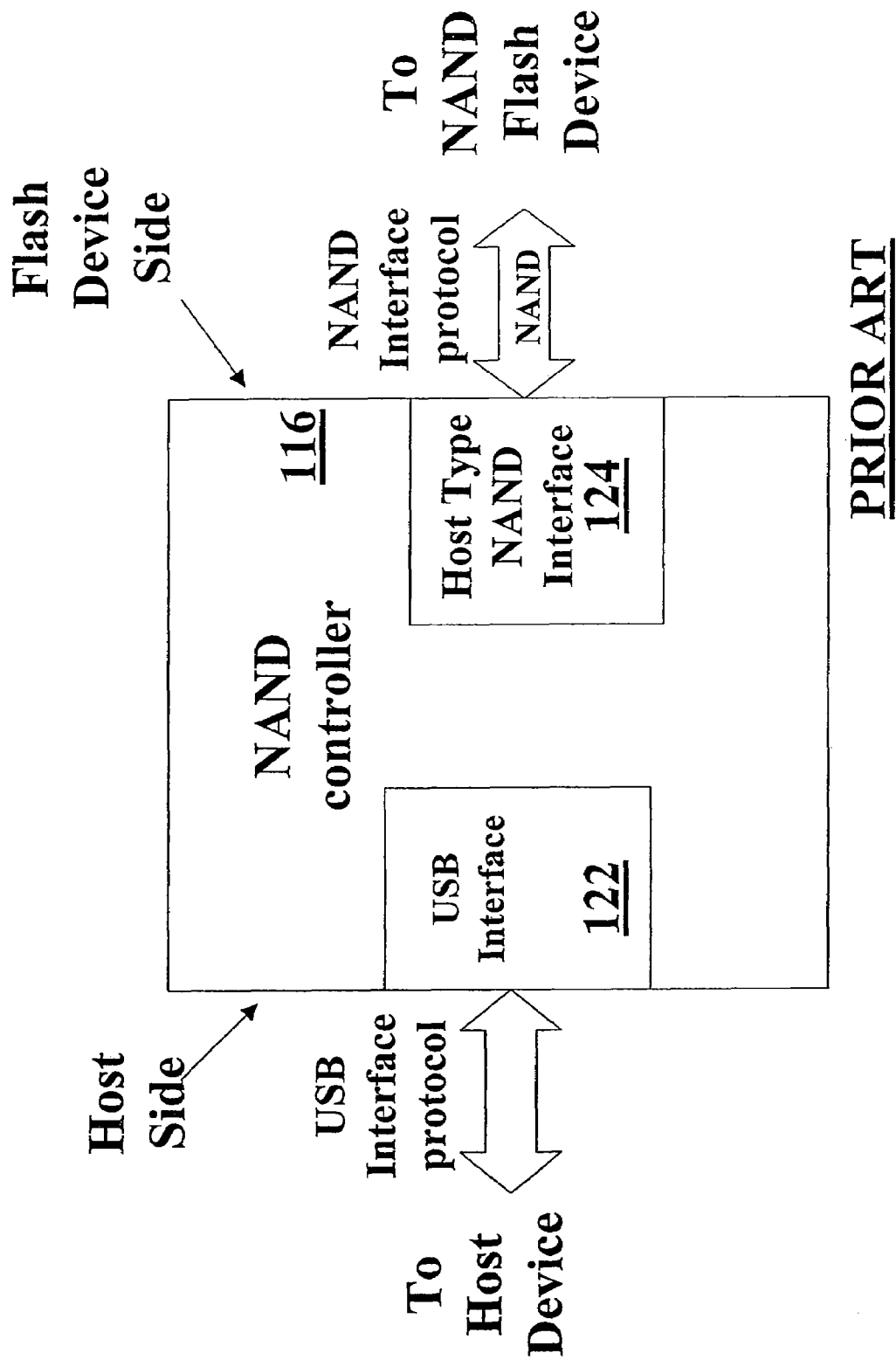
FIG. 3B provides a block diagram of a prior art NAND controller having a USB interface on the host side and a NAND interface on the flash memory device side.
Figure 4:
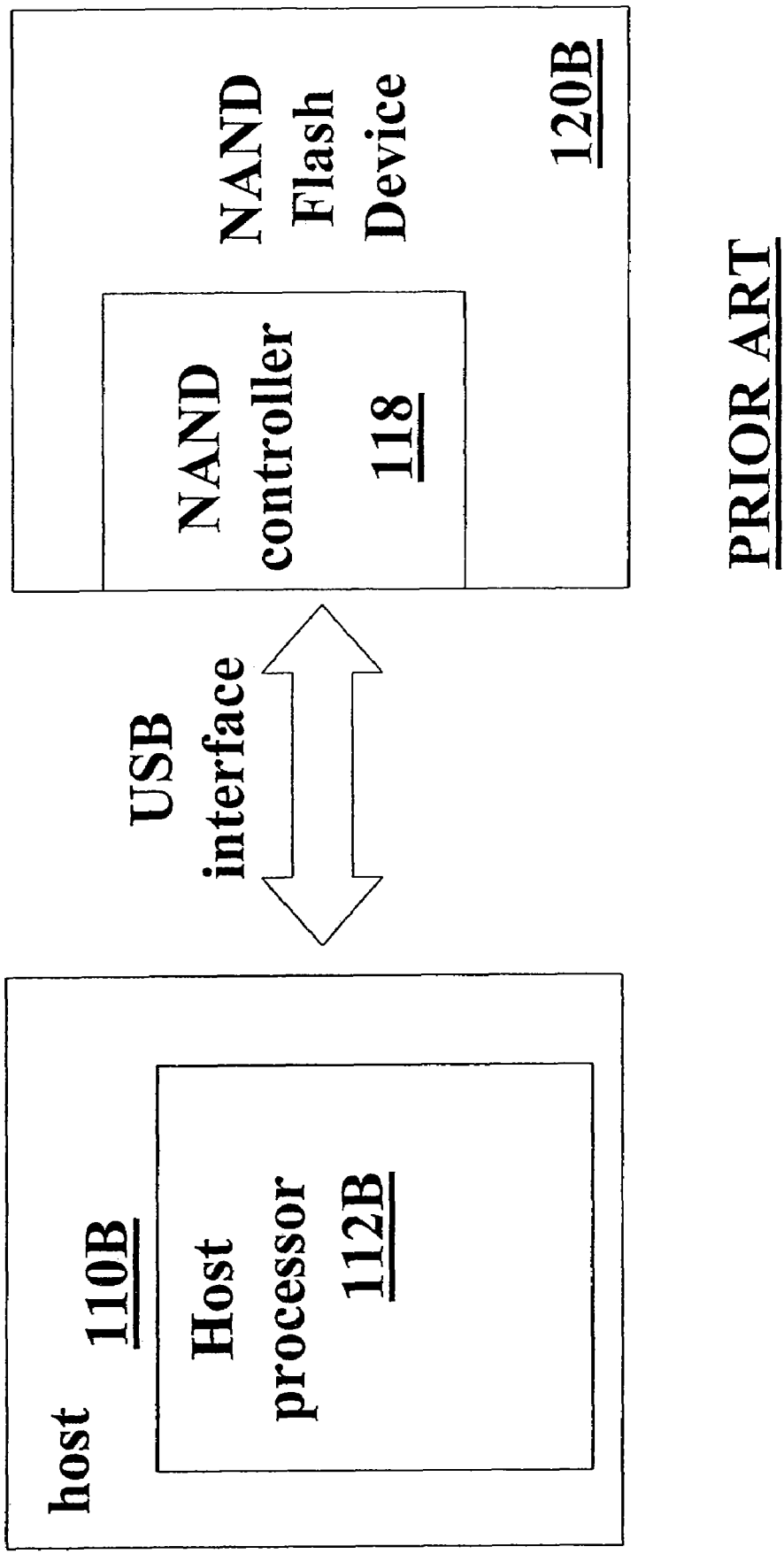
FIG. 4 provides a block diagram of a prior art system including a host device and a NAND flash device.
Figure 5A:
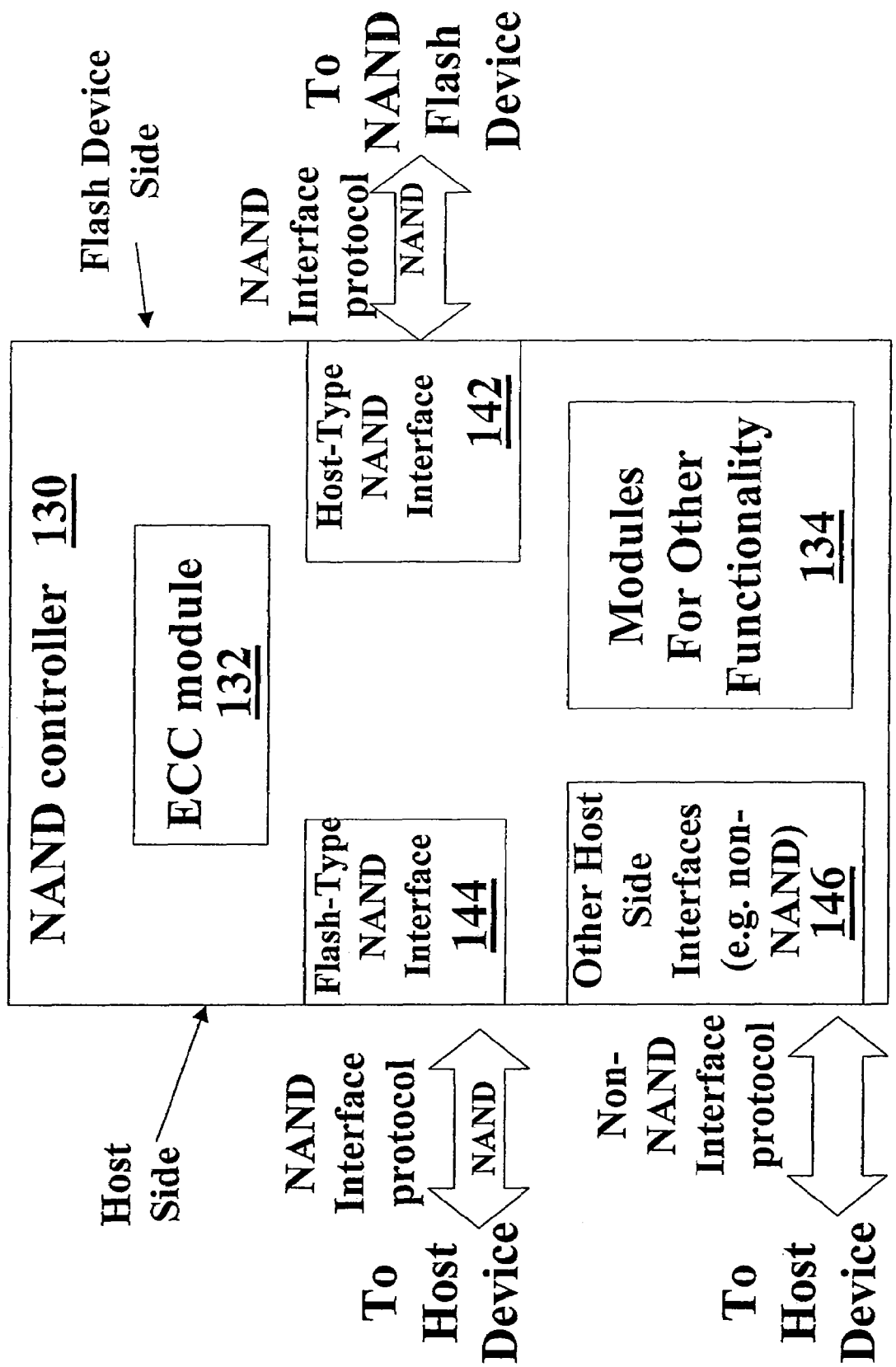
FIG. 5A provides a block diagram of a NAND controller having a NAND interface on the host side and a NAND interface on the flash memory device side in accordance with exemplary embodiments of the present invention.

Attention is now called to FIG. 5A, which provides a schematic block diagram of a controller in accordance with some embodiments of the present invention. Controller 130 includes a flash memory device-side NAND interface 142 for interfacing to a NAND flash device. Furthermore, it is noted that flash memory device-side NAND interface 142 is also a host-type NAND interface (i.e. adapted to initiate the interaction over the NAND interface, and to present a host device to a NAND flash device).

The controller 130 also includes a host side NAND interface 144 for interfacing to a host that supports a NAND interface protocol. This host side NAND interface is also a flash memory-type NAND interface (e.g. the controller 130 is adapted to present to the host a NAND flash memory storage device). The controller may optionally include one or more additional host-side interfaces 146, for interfacing the controller to hosts using non-NAND interfaces, such as USB or MMC interfaces.

As shown in FIG. 5A, the controller further includes an ECC module 132 for detecting and correcting all or some of the errors in the data retrieved from the NAND device through device-side interface 142. The ECC module 132 may include hardware, software, firmware or any combination thereof. The ECC module 132 may correct all errors, in which case the NAND controller 130 exports to the host an error-free NAND device. Alternatively, the ECC module 132 may correct only some of the errors found in the data retrieved from the NAND device through the flash memory device-side NAND interface 142.

In one example, the NAND device may have a reliability that requires 4-bit ECC, and the ECC module 142 corrects enough of the errors to increase the data reliability up to the level that enables a 1-bit ECC module in the host's built-in NAND controller to handle the data.

It is noted that NAND controller 130 may optionally also include one or more modules 134 (e.g. including hardware, software, firmware or any combination thereof) for providing other functionality, such as encryption functionality or address mapping that maps logical flash addresses received from the host into physical flash addresses sent to the flash device.

Figure 5B:
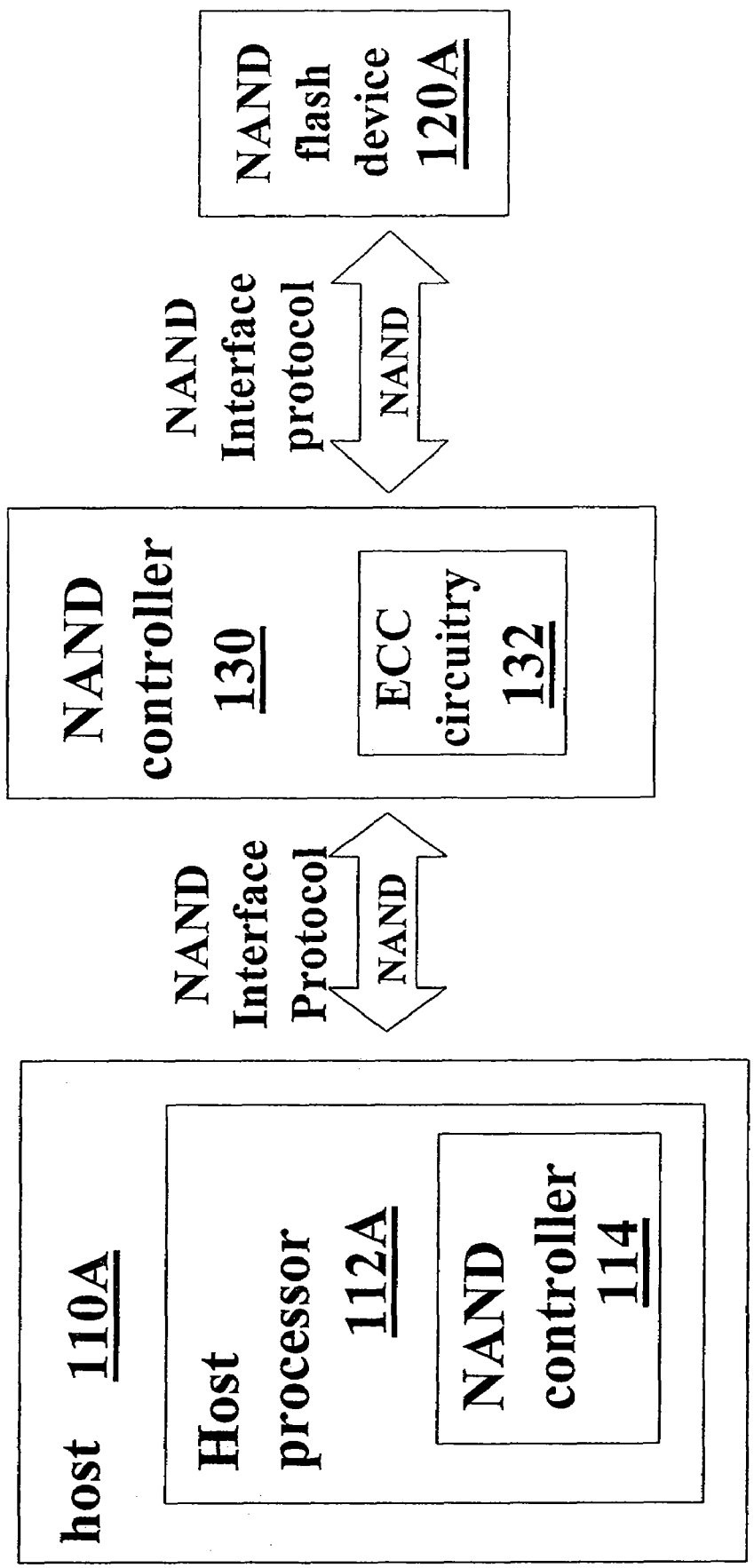
FIG. 5B provides a block diagram of a system including a host device, the NAND controller of FIG. 5A, and a NAND flash device in accordance with exemplary embodiments of the present invention.

Attention is now called to FIG. 5B which shows a schematic block diagram of an exemplary system including the external NAND controller 130 (e.g. a controller separate from the host device) described in FIG. 5A. Through device side NAND interface 142 the external NAND controller 130 interfaces with NAND flash device 120A. Through host side NAND interface 144, the NAND controller 130 interfaces with host device 110A.

One should note that the way external controller 130 interfaces through the two NAND interfaces 142 and 144 is not identical. The NAND interface protocol is not symmetrical—there is an initiator side that initiates the transactions ("host-type" according to the previously defined terminology) and there is a responding side that only responds to the initiating signals ("flash-type" according to the previously defined terminology).

Using device side NAND interface 142, external NAND controller 130 acts as the host-type part of the NAND interface protocol and the NAND device 130 acts as the flash-type part of the NAND interface protocol. Using host side interface 144, external controller 130 acts as the flash-type part of the NAND interface protocol and host 110A acts as the host-type part of the NAND interface protocol.

Figure 6A:
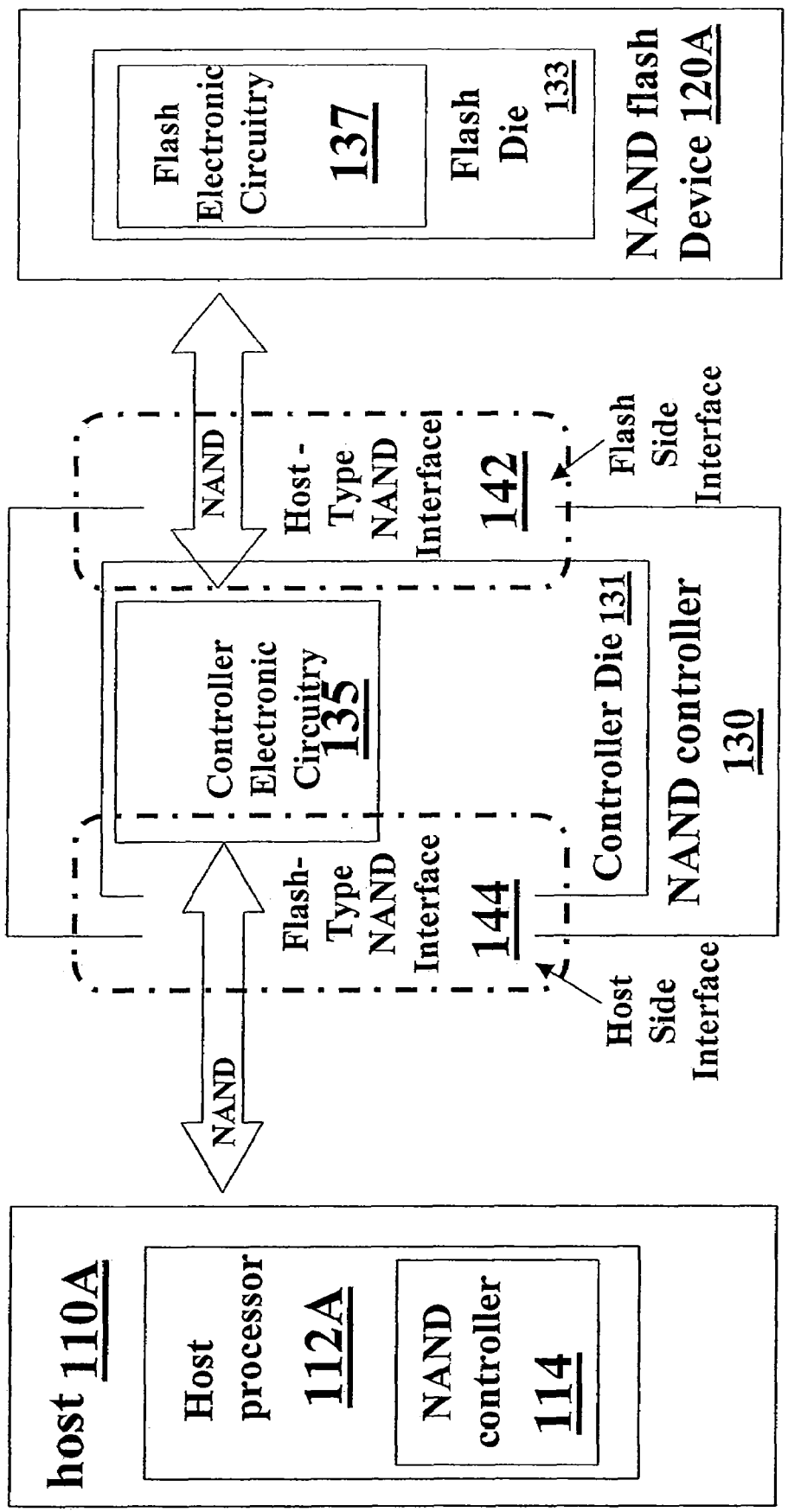
FIG. 6A illustrates an exemplary die configuration of the exemplary system described in FIG. 5B.

Attention is now called to FIG. 6A which shows an exemplary die configuration of the exemplary system described in FIG. 5A. Thus, it is noted that the NAND controller 130 includes electronic circuitry 135 fabricated on a controller die 131 while the NAND flash device 120A includes electronic circuitry 137 fabricated on a flash die 133. The controller die 131 and the flash die 133 are distinct dies.

It is noted that elements within the NAND controller 130 as described in FIG. 5A (i.e. the ECC module 132, the flash-type NAND interface 144, the host-type NAND interfaces) are implemented at least in part by the controller electronic circuitry 135 residing on the controller die.

The interface 142 between the controller electronic circuitry 135 and the flash electronic circuitry 137 is an "inter-die" interface. As used herein, an "inter-die interface" (e.g. an inter-die NAND interface) is operative to interface between two distinct units of electronic circuitry residing on distinct dies (e.g. to provide the necessary physical and logical infrastructure for the distinct units of electronic circuitry to communicate with each other, for example, using one or more specific protocols). Thus, the inter-die interface includes the necessary physical elements (pads, output and input drivers, etc) for interfacing between the two distinct units of electronic circuitry residing on separate dies.

According to some embodiments, an inter-die interface may interface between electronic circuitry fabricated on two distinct dies that are packaged in a common package. This example is illustrated in FIG. 6B, wherein both the NAND controller 130 and the NAND flash device 120A reside within a common multi-chip package 139.

Alternatively, the inter-die interface may interface between electronic circuitry fabricated on two distinct dies packaged in distinct packages (for example, where each die is packaged in its own package). This example is illustrated in FIG. 6C, wherein the NAND controller 130 and the NAND flash device 120A reside in separate respective packages. In particular, the NAND controller 130 resides within controller package 141, while the NAND flash device 120A resides within flash package 143. Thus, as illustrated in FIG. 6C, interface 142 is an "inter-package interface."

Figure 6B:
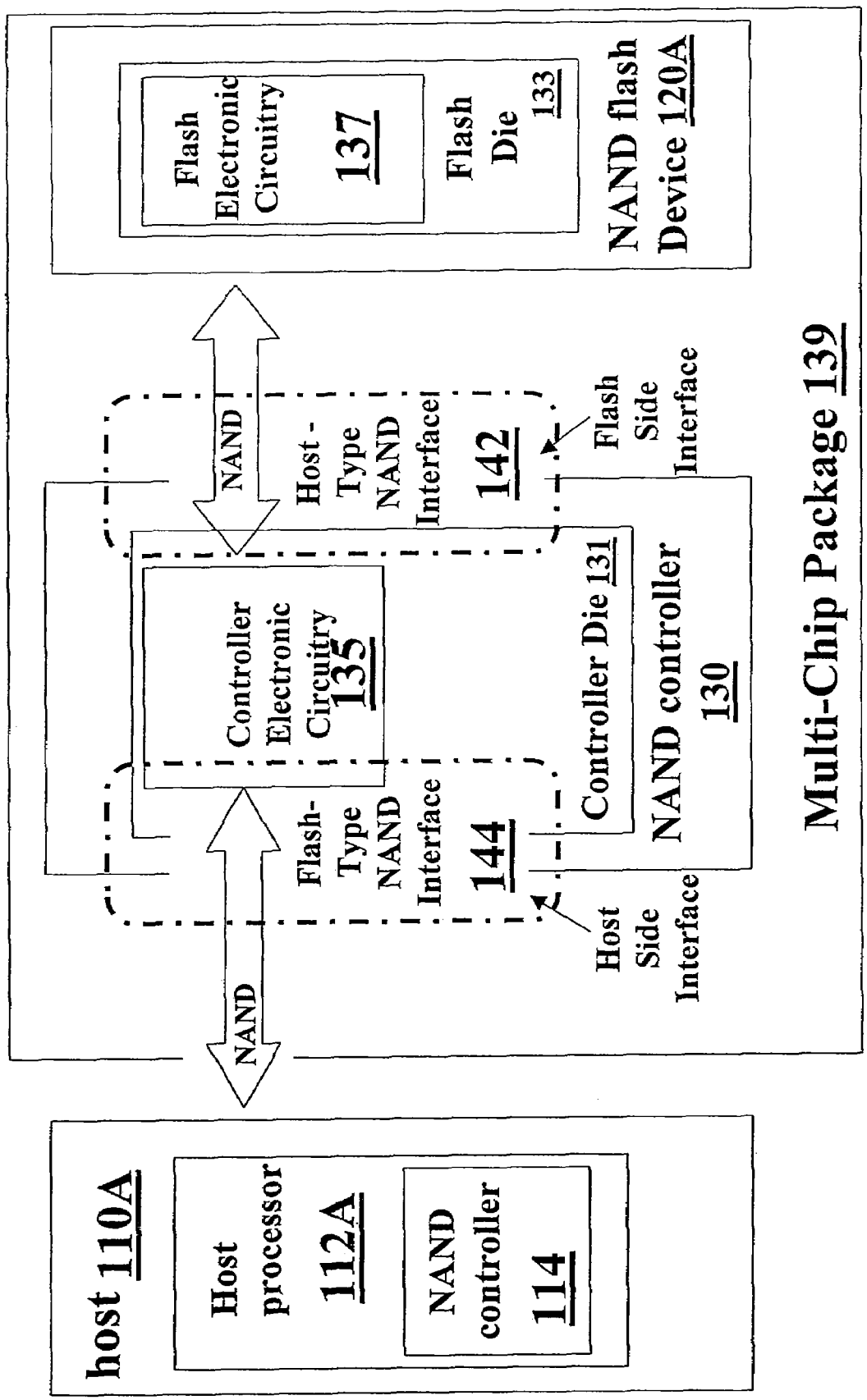
FIG. 6B illustrates an exemplary configuration of the exemplary system described in FIG. 5B where the NAND controller and the NAND flash device reside within a single multi-chip package.
Figure 6C:
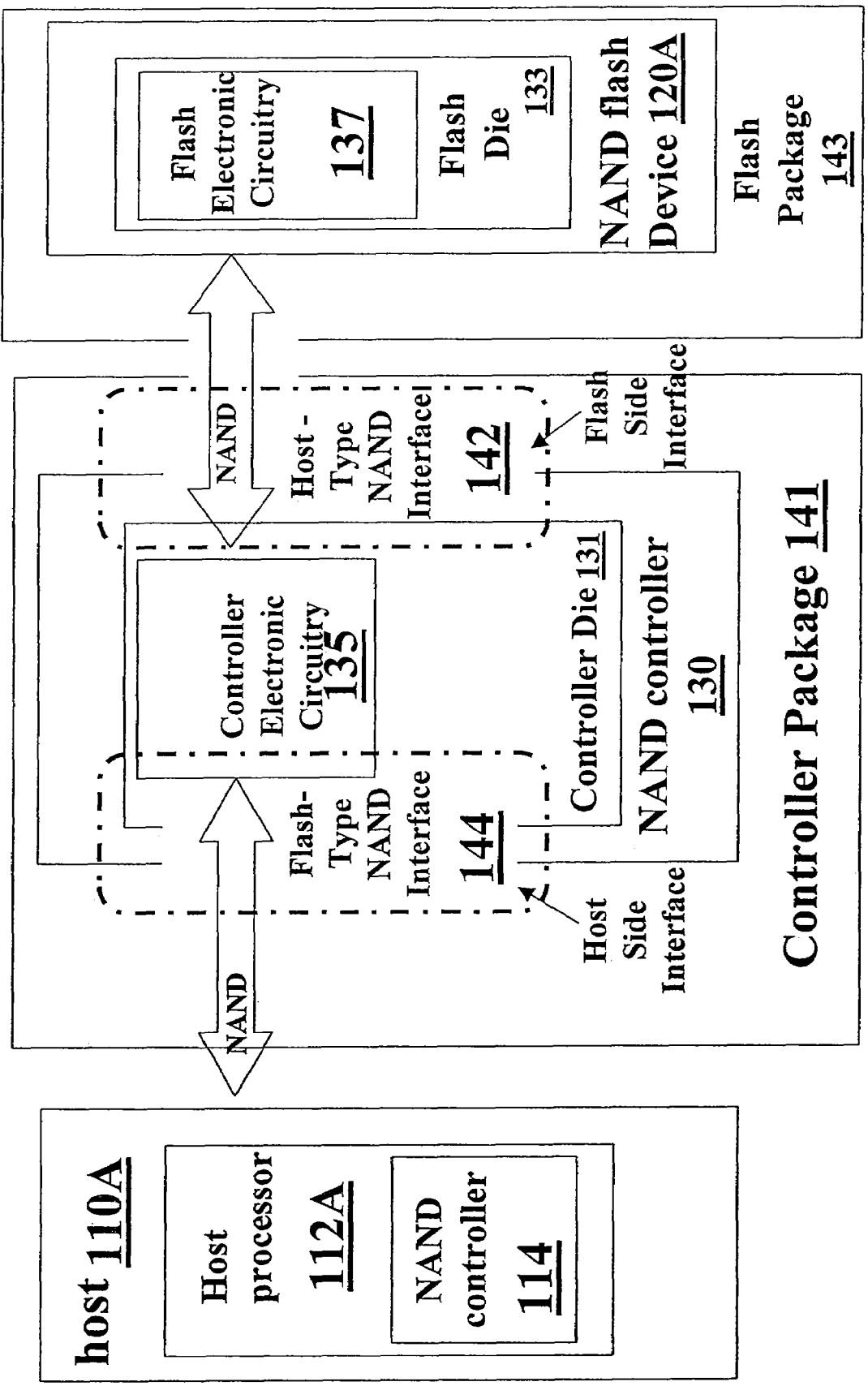
FIG. 6C illustrates an exemplary configuration of the exemplary system described in FIG. 5B where the NAND controller and the NAND flash device reside within separate respective packages.

It is noted that the examples where the dies reside in a common package (for example, as shown in FIG. 6A) and where the dies reside in separate packages (for example, as shown in FIG. 6B) are not the only possible configurations.

Thus, alternatively, in some embodiments, the inter-die interface may interface between electronic circuitry fabricated on two distinct dies, where one or both of these dies has no package at all. For example, in many applications, due to a need to conserve space, memory dies are provided (e.g. mounted, for example, directly mounted) on boards with no packaging at all. Thus, in one example, it is noted that in the new generation of memory cards for phones, memory dies are often mounted on boards with no packaging at all. As used herein, a die which is "directly mounted" onto a printed circuit board is mounted on the printed circuit board without being packaged first.

Figure 7:
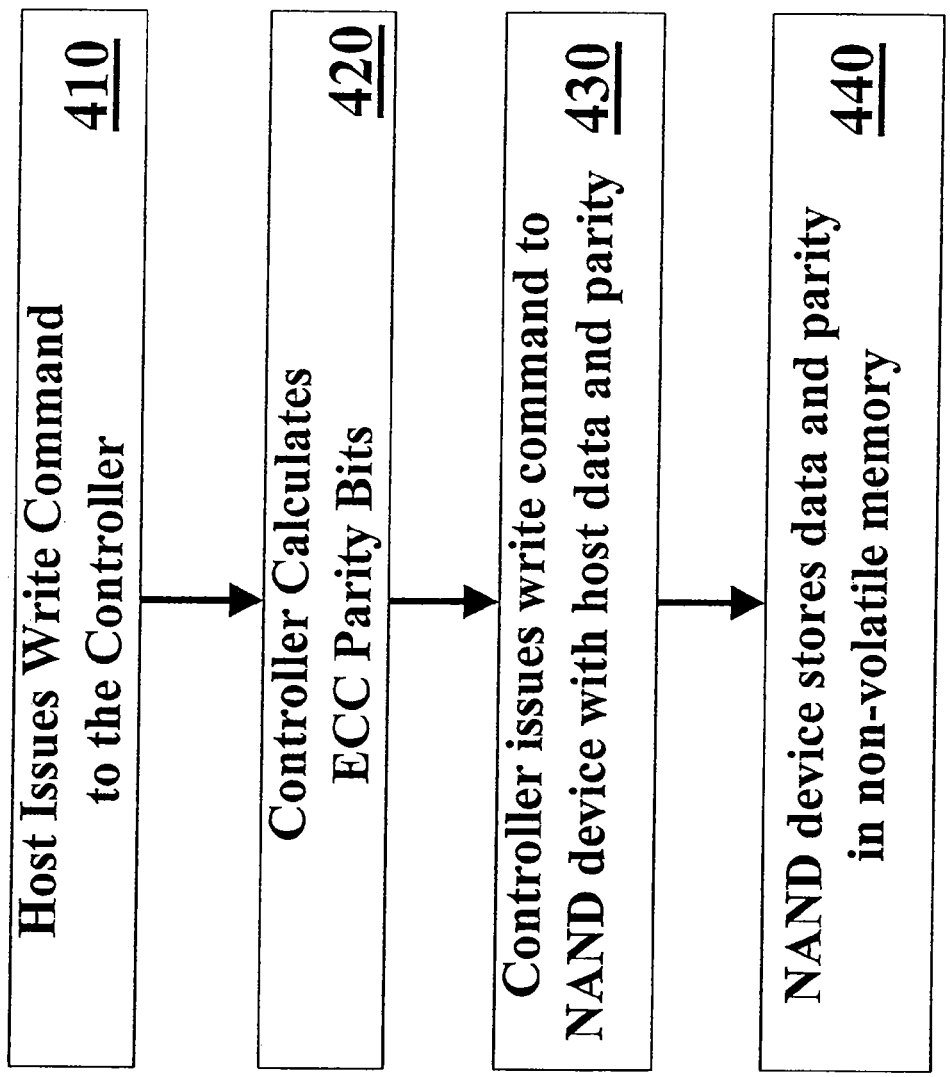
FIG. 7 shows a flow chart describing a method wherein a host writes data to a NAND storage device via an external NAND controller.

FIG. 7 shows a flow chart describing a method wherein a host 110A (e.g. a host including a NAND controller 114 within the device) writes data (e.g. a page of data) to a NAND storage device 120A via an external NAND controller 130. As shown in FIG. 7, the host 110A issues 410 a write command to the external controller 130 (e.g. a write command issued using the NAND interface protocol, including command bytes, address bytes and data bytes). The host 110A is not necessarily aware of the fact it is issuing the command to a controller 130, and may assume it is interfacing with a standard NAND flash storage device of the type it is capable of handling.

The NAND controller 130 receives the write command issued by the host (e.g. via the host-side NAND interface 144). After receiving the write command, the controller calculates ECC parity bits 420 (e.g. using ECC module 132) corresponding to the data bytes, and issues 430 a write command to the NAND device (e.g. via the flash memory device side interface 142). Again, the command is issued according to the NAND interface protocol, including command bytes, address bytes and data bytes that contain both the host's data bytes and the corresponding ECC parity bits. The NAND flash storage device is not necessarily aware that it received the command indirectly via the NAND controller 130 and not directly from the host device 110A. In step 440 the NAND flash storage device 120A stores the data bytes it received into the non-volatile memory cells, thus fulfilling the host's 110A request.

Figure 8:
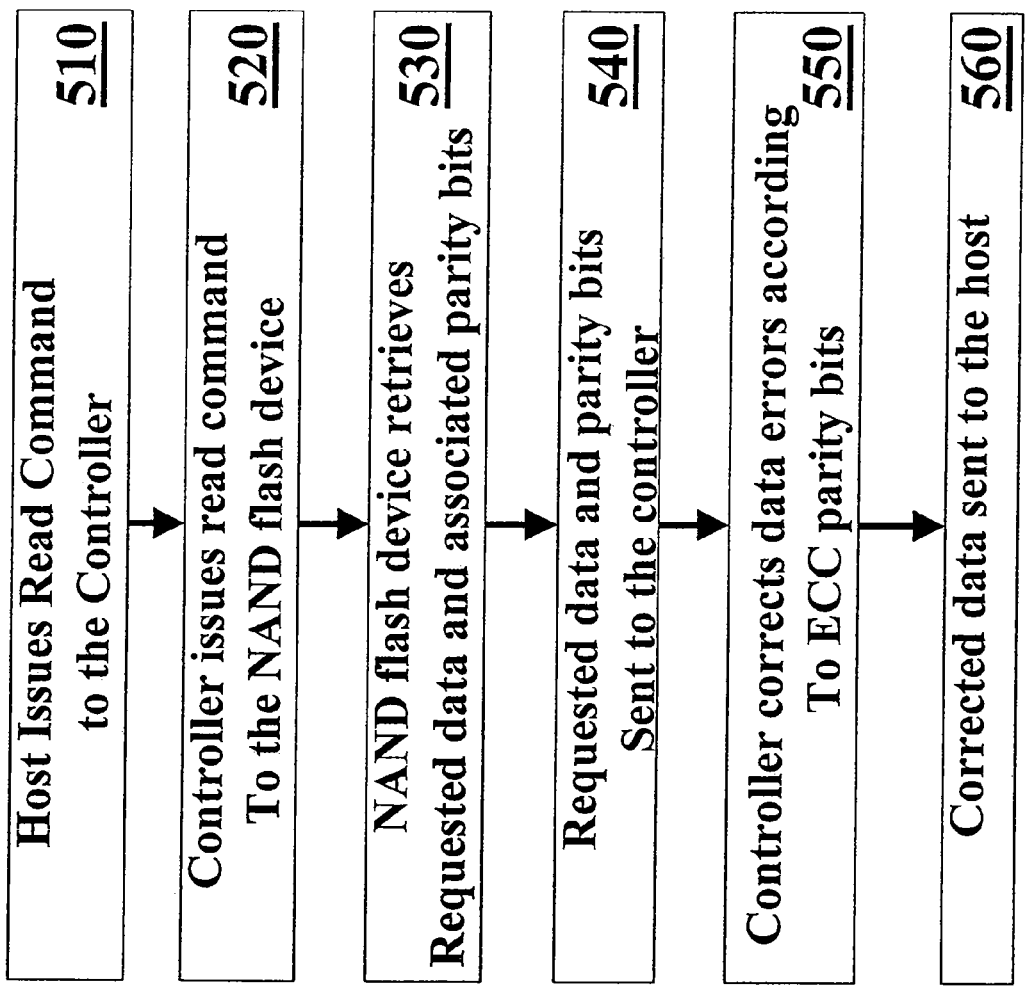
FIG. 8 shows a flowchart describing a method wherein a host reads data from a NAND storage device 120 via an external NAND controller.

FIG. 8 shows a flowchart describing a method wherein a host 110A (e.g. a host including a NAND controller 114 within the device) reads data (e.g. a page of data) from a NAND storage device 120A via an external NAND controller 130. Thus, the host 110A issues 410 a read command to the external controller 130 (e.g. a read command issued using the NAND interface protocol, including command bytes and address bytes). As in the write command above, the host 110A is not necessarily aware of the fact it is issuing the command to an external controller 130, and may assume it is interfacing with a standard NAND device of the type it is capable of handling.

The external NAND controller 130 receives the read command issued by the host (e.g. via the host-side NAND interface 144). After receiving the read command, the external controller 130 issues 520 a read command (e.g. via the device-side NAND interface 142) to the NAND device 120A. Again, the command is issued according to the NAND interface protocol, including command bytes and address bytes. In step 530 the NAND flash storage device 120A retrieves the requested data from the non-volatile cells array, where the host data is accompanied by the ECC parity bits calculated when the data had been stored. In step 540 the data bytes and the accompanying parity bits are sent to the external NAND controller. This sending is done according to the NAND interface protocol by a series of read strobes generated by the controller, each sequentially reading into the controller one byte or one word (depending on whether the NAND interface used is 8 bits wide or 16 bits wide). In step 550 the external NAND controller 130 uses the parity bits for correcting errors in the data bytes (e.g. with the ECC module 132). In step 560 the corrected data bytes are sent to the host via the host side NAND interface 144. The sending is again done according to the NAND interface protocol by a series of read strobes generated by the host. The host 110A now has the same data bytes it originally stored into the flash memory.

It can now be seen that this invention allows one to benefit from the cost advantage of new NAND devices, while using a host processor incorporating a built-in NAND controller designed to support a previous generation of NAND devices.

In the description and claims of the present application, each of the verbs, "comprise" "include" and "have", and conjugates thereof, are used to indicate that the object or objects of the verb are not necessarily a complete listing of members, components, elements or parts of the subject or subjects of the verb.

The present invention has been described using detailed descriptions of embodiments thereof that are provided by way of example and are not intended to limit the scope of the invention. The described embodiments comprise different features, not all of which are required in all embodiments of the invention. Some embodiments of the present invention utilize only some of the features or possible combinations of the features. Variations of embodiments of the present invention that are described and embodiments of the present invention comprising different combinations of features noted in the described embodiments will occur to persons of the art.

What is claimed is:

1. A controller for interfacing between a host controller in a host device and a flash memory device, the controller comprising:
   a first NAND interface configured to transfer data between the host controller and the controller using a NAND interface protocol, wherein the first NAND interface is further configured to receive, from the host controller, (i) one of a read command and a write command and (ii) a logical address;
   an address conversion module configured to convert the logical address received from the host controller to a physical address of the flash memory device;
   a second NAND interface configured to transfer data between the controller and the flash memory device using a NAND interface protocol in accordance with the one of the read command and the write command received from the host controller; and
   an error correction code (ECC) module configured to calculate ECC bits for data received through at least one of the first and second NAND interfaces.

2. The controller of claim 1 further comprising an encryption module.

3. The controller of claim 1, wherein the NAND interface protocol used by the first NAND interface is the same as the NAND interface protocol used by the second NAND interface.

4. The controller of claim 1, wherein the NAND interface protocol used by the first NAND interface is different from the NAND interface protocol used by the second NAND interface.

5. The controller of claim 1, wherein a bus between the host device and the controller is different from a bus between the controller and the flash memory device.

6. The controller of claim 1, wherein the controller and the flash memory device both reside within a common multi-chip package.

7. The controller of claim 1, wherein the controller and the flash memory device are packaged in different packages.

8. The controller of claim 1, wherein the controller and the flash memory device are integrated on a same die.

9. A controller for interfacing between a host controller in a host device and a flash memory device, the controller comprising:
   a first NAND interface configured to transfer data between the host controller and the controller using a NAND interface protocol, wherein the first NAND interface is further configured to receive, from the host controller, (i) one of a read command and a write command and (ii) a physical address of the flash memory device;
   a second NAND interface configured to transfer data between the controller and the flash memory device using a NAND interface protocol in accordance with the one of the read command and the write command received from the host controller; and
   an error correction code (ECC) module configured to calculate ECC bits for data received through at least one of the first and second NAND interfaces.

10. The controller of claim 9 further comprising an additional functionality module.

11. The controller of claim 10, wherein the additional functionality module comprises an encryption module.

12. The controller of claim 10, wherein the additional functionality module comprises an address mapping module.

13. The controller of claim 9, wherein the NAND interface protocol used by the first NAND interface is the same as the NAND interface protocol used by the second NAND interface.

14. The controller of claim 9, wherein the NAND interface protocol used by the first NAND interface is different from the NAND interface protocol used by the second NAND interface.

15. The controller of claim 9, wherein a bus between the host device and the controller is different from a bus between the controller and the flash memory device.

16. The controller of claim 9, wherein the controller and the flash memory device both reside within a common multi-chip package.

17. The controller of claim 9, wherein the controller and the flash memory device are packaged in different packages.

18. The controller of claim 9, wherein the controller and the flash memory device are integrated on a same die.

19. A method for interfacing between a host controller in a host device and a flash memory device, the method comprising:
   performing in a controller in communication with the host controller and the flash memory device:

receiving (i) one of a read command and a write command and (ii) a logical address, wherein (i) the one of the read command and the write command and (ii) the logical address are received through a first NAND interface of the controller using a NAND interface protocol;

converting the logical address received from the host controller to a physical address of the flash memory device;

transferring data between the host controller and the controller in accordance with the one of the read command and the write command received from the host controller, wherein the data is transferred through the first NAND interface of the controller using the NAND interface protocol;

transferring data between the controller and the physical address of the flash memory device in accordance with the one of the read command and the write command received from the host controller, wherein the data is transferred through a second NAND interface of the controller using a NAND interface protocol; and calculating error correction code (ECC) bits for the data received through at least one of the first and second NAND interfaces.

20. The method of claim 19 further comprising performing an encryption function on data received through at least one of the first and second NAND interfaces.

21. The method of claim 19, wherein the NAND interface protocol used by the first NAND interface is the same as the NAND interface protocol used by the second NAND interface.

22. The method of claim 19, wherein the NAND interface protocol used by the first NAND interface is different from the NAND interface protocol used by the second NAND interface.

23. The method of claim 19, wherein a bus between the host device and the controller is different from a bus between the controller and the flash memory device.

24. The method of claim 19, wherein the controller and the flash memory device both reside within a common multi-chip package.

25. The method of claim 19, wherein the controller and the flash memory device are packaged in different packages.

26. The method of claim 19, wherein the controller and the flash memory device are integrated on a same die.

27. A method for interfacing between a host controller in a host device and a flash memory device, the method comprising:

performing in a controller in communication with the host controller and the flash memory device:

receiving (i) one of a read command and a write command and (ii) a physical address of the flash memory device from the host controller, wherein (i) the one of the read command and the write command and (ii) the physical address are received through a first NAND interface of the controller using a NAND interface protocol;

transferring data between the host controller and the controller in accordance with the one of the read command and the write command received from the host controller, wherein the data is transferred through the first NAND interface of the controller using the NAND interface protocol;

transferring data between the controller and the physical address of the flash memory device in accordance with the one of the read command and the write command received from the host controller, wherein the data is transferred through a second NAND interface of the controller using a NAND interface protocol; and calculating error correction code (ECC) bits for the data received through at least one of the first and second NAND interfaces.

28. The method of claim 27 further comprising performing an additional function using an additional functionality module of the controller.

29. The method of claim 28, wherein performing the additional function comprises performing an encryption function on data received through at least one of the first and second NAND interfaces.

30. The method of claim 27, wherein the NAND interface protocol used by the first NAND interface is the same as the NAND interface protocol used by the second NAND interface.

31. The method of claim 27, wherein the NAND interface protocol used by the first NAND interface is different from the NAND interface protocol used by the second NAND interface.

32. The method of claim 27, wherein a bus between the host device and the controller is different from a bus between the controller and the flash memory device.

33. The method of claim 27, wherein the controller and the flash memory device both reside within a common multi-chip package.

34. The method of claim 27, wherein the controller and the flash memory device are packaged in different packages.

35. The method of claim 27, wherein the controller and the flash memory device are integrated on a same die.

* * * * *

UNITED STATES PATENT AND TRADEMARK OFFICE
CERTIFICATE OF CORRECTION

PATENT NO. : 7,631,245 B2
APPLICATION NO. : 11/326336
DATED : December 8, 2009
INVENTOR(S) : Menahem Lasser It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 944 days.

Signed and Sealed this

Second Day of November, 2010

David J. Kappos
*Director of the United States Patent and Trademark Office*